United States Patent [19]

Fukuta

[11] Patent Number: 4,512,030
[45] Date of Patent: Apr. 16, 1985

[54] HIGH SPEED PRESETTABLE COUNTER

[75] Inventor: Masaru Fukuta, Yokohama, Japan
[73] Assignee: Motorola, Inc., Schaumburg, Ill.
[21] Appl. No.: 461,837
[22] Filed: Jan. 28, 1983
[51] Int. Cl.³ .................. H03K 19/017; H03K 21/36; H03K 23/22
[52] U.S. Cl. .................... 377/107; 377/117; 377/121; 377/105; 307/450
[58] Field of Search ........ 307/450, 574, 581; 377/107, 116, 117, 121

[56] References Cited
U.S. PATENT DOCUMENTS

| | | | |
|---|---|---|---|
| 3,930,169 | 12/1975 | Kuhn | 377/107 |
| 4,002,926 | 1/1977 | Moyer | 377/121 |
| 4,330,751 | 5/1982 | Swain | 377/107 |
| 4,435,658 | 3/1984 | Murray et al. | 307/450 |
| 4,469,962 | 9/1984 | Snyder | 377/117 |

Primary Examiner—John S. Heyman
Attorney, Agent, or Firm—Walter W. Nielsen

[57] ABSTRACT

A high speed countdown counter (FIG. 7) capable of operation at up to 10 MHz is provided which comprises a number of stages each comprising a flip flop (134, 136; 144, 146; etc.), a preset data input (IN1, IN2, etc.), a carry input (N11, N10, etc.), a data output (N5, N4, etc.), and a carry output.

Dynamic Depletion Mode (DDM) transistors (129, 139, etc.) are employed to reduce charging time at interstage nodes and thereby improve speed, while minimizing circuit size and power requirements.

A look-ahead feature enables early detection of an "all zero minus one" count and enables the presetting of data into the counter simultaneously with the generation of a "carry out" signal from the counter. Various internal counter control signals are delayed by couplers driven by a two-phase non-overlapping clock, in order to allow for signal propagation time through the corresponding circuit elements.

5 Claims, 7 Drawing Figures

HIGH SPEED PRESETTABLE COUNTER

TECHNICAL FIELD

This invention relates generally to a semiconductor integrated circuit device, and, in particular, to a high speed presettable digital counter which may be used, for example, in a television integrated circuit.

BACKGROUND OF THE INVENTION

In a circuit, such as a counter, requiring high speed operation, it is a problem how to get fast rise times at various internal circuit nodes. To eliminate the rise time with general enhancement/depletion (E/D) type MOS circuits, a large current depletion-type load device is required to charge the load capacitor fast. However, large current loads require large switch devices, and it causes an increase in the effective load capacitance.

A Dynamic Depletion Mode (DDM) method of getting fast rise times without enlarging the switch size is described in "Dynamic Depletion Mode: An E/D MOS FET Circuit Method for Improved Performance", RONALD W. KNEPPER, *IEEE Journal of Solid State Circuits*, Vol. SC-13, No. 5, October 1978. But DDM requires many individual circuit elements so that adapting DDM to all large gates produces a very complex logic circuit when a conventional presettable counter is implemented.

A known carry generator consisting of switches in series inherently has the capability of high speed carry transmission because the carry is transmitted by current mode. But this type carry generator cannot be applied to a circuit intended to operate above 1 MHz, because it is difficult to get a high speed rise time at the carry nodes.

Adapting large current load devices to get a fast rise time, the ON resistance of the switch devices is not negligible, and the voltage drop VDS (drain/source) makes the output voltage $V_{OL}$ level high. Therefore, the operation becomes unstable.

To avoid increasing the $V_{OL}$ level, the switch size must be enlarged. However if large switch devices are adapted, the large $C_{Dsub}$ and $C_{Ssub}$ increases the effective load capacitance of the carry nodes. Consequently the above measures don't achieve the desired objective of fast operation and compact size.

The High Speed Presettable Counter of the present invention overcomes the limitations of the prior art counters and is able to achieve a very high speed of operation, for example 10 MHz.

BRIEF SUMMARY OF INVENTION

Accordingly, it is an object of the present invention to provide an improved digital counter.

It is also an object of the present invention to provide a high speed digital counter with presettable inputs.

These and other objects are achieved in accordance with a preferred embodiment of the invention by providing a high speed presettable counter, the counter being driven by a two-phase non-overlapping clock, the counter comprising a voltage source; a plurality of counter stages, each stage comprising logic means for storing a binary number and generating an output corresponding to the stored binary number, a preset data input, a preset data enable input responsive to a preset data enable signal for loading into the logic means a binary number received over the preset data input, a carry input, and means responsive to the stored binary number and to the carry input for generating a carry output; a plurality of coupling transistors, each coupled between the carry output of a given counter stage and the carry input of the next higher counter stage, the coupling transistors being enabled in response to the output of the respective given counter stage; a plurality of dynamic depletion mode (DDM) gating transistors, each coupled between the voltage source and the carry output of a respective counter stage, the DDM gating transistors being enabled in response to a gate control signal; means responsive to all of the counter stage outputs for generating an "all zero minus one" signal when all but the lowest order counter stage output is a zero; means responsive to the preset data enable signal for generating the gate control signal, such means including a pair of first and second enhancement mode gating transistors each responsive, respectively, to a different phase of the clock; means responsive to the "all zero minus one" signal for generating the preset data enable signal, the means including a third enhancement mode gating transistor responsive to one phase of the clock; means, including a DDM transistor, in the lowest order counter stage and responsive to the binary number stored in the lowest order counter stage for generating the carry output from the lowest order counter stage, the means including a pair of fourth and fifth enhancement mode gating transistors each responsive, respectively, to a different phase of the clock, whereby the generation of the gate control signal, of the preset data enable signal, and of the carry output from the lowest order counter stage is each delayed to allow for signal propagation delays through the counter.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

APPENDIX A provides a list of definitions of the various signals shown on the FIGURES and described in the specification.

APPENDIX B shows a timing diagram illustrating the operation of the 6-stage circuit shown in FIG. 7.

DETAILED DESCRIPTION OF THE INVENTION

The high speed presettable counter will be described first in terms of the "bit 0" counter stage, then an exemplary one of the other N stages, then a 3-bit downcounter, and finally a 6-bit downcounter which represents a preferred embodiment of the invention.

Figure 1:
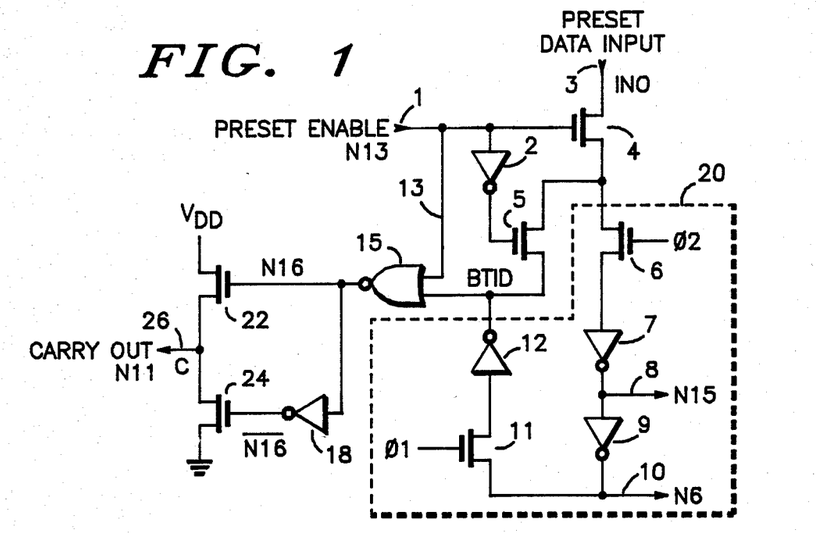
FIG. 1 shows a logic diagram illustrating the "bit 0" stage of the high speed presettable counter of the present invention.

Referring now to FIG. 1, a logic diagram illustrating the "bit 0" stage of the high speed presettable counter of the present invention is shown. The bit 0 stage comprises a storage element 20 comprising a two-phase clocked D-type flip flop in the form of inverters 7 and 9, whose input IN0 is received at preset data input 3, and which has an output N15 and an inverted output N6. The IN0 preset data input is coupled to the flip flop input through a coupling transistor 4 whose gate is controlled by a preset enable signal N13 on input 1.

For the reader's convenience, APPENDIX A provides a list of definitions of the most significant signals shown on the FIGURES and described in the specification.

The bit 0 storage element also comprises an inverter 12 responsive to the flip flop output and generating an output signal to node BT1D.

The preset data is coupled into the flip flop through a coupling transistor 6 which is gated by $\emptyset 2$ of the clock. The clock is a two-phase non-overlapping clock generated by conventional means. The output of inverter 9 is coupled into inverter 12 through coupling transistor 11 which is gated by clock $\emptyset 1$.

Outside the dashed line portion 20 representing the storage element of the bit 0 stage, the remainder of the circuit elements are employed primarily for the carry out operation to the next stage.

NOR gate 15 has a first input coupled to line 13 for receiving the preset enable signal N13 and a second input coupled to node BT1D. A coupling transistor 5 is coupled between the drain of coupling transistor 6 and node BT1D, and its gate is connected to the output of an inverter 2 whose input is coupled to the preset enable input 1. NOR gate 15 has an output N16, which is applied to the gate of Dynamic Depletion Mode (DDM) transistor 22. DDM transistor 22 has its drain connected to a voltage source VDD.

A DDM transistor need not differ in structure from a conventional depletion mode transistor. The chief difference is that a conventional depletion mode transistor has its gate connected to its source, whereas a DDM transistor has its gate connected to a gate control circuit for varying the ON resistance of the transistor dynamically. When the DDM transistor gate voltage is low, the DDM transistor is "soft" ON, and when its gate voltage is high, the DDM transistor is "hard" ON.

The output of NOR gate 15 is also applied to inverter 18 whose output is the complement of N16 and is applied to the gate of coupling transistor 24. Transistor 24 has its drain connected to the source of DDM transistor 22 and its source connected to ground. A carry out signal C is generated over line 26 from the junction between the source of DDM transistor 22 and the drain of transistor 24.

Figure 2:
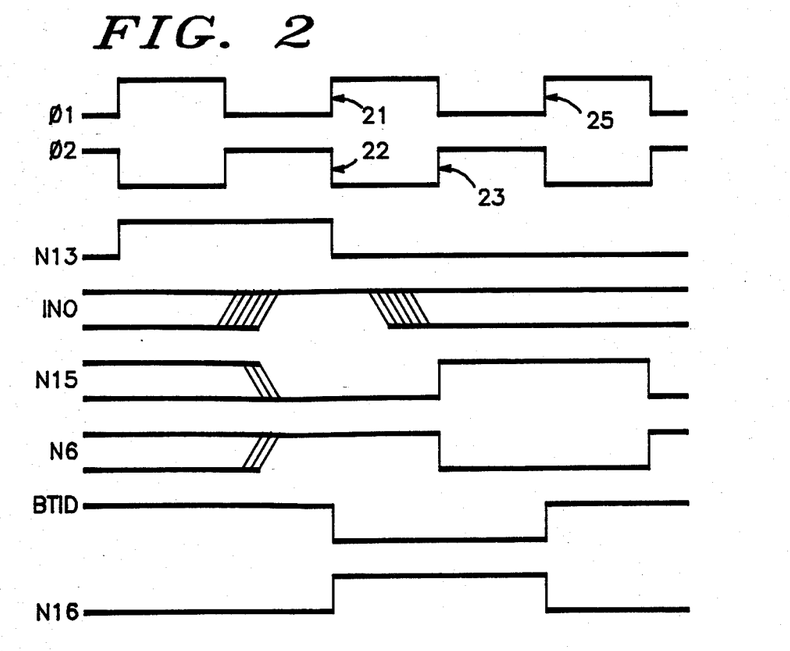
FIG. 2 shows a timing diagram illustrating the operation of the "bit 0" stage shown in FIG. 1.

FIG. 2 shows a timing diagram illustrating the operation of the "bit 0" stage shown in FIG. 1. The two-phase clocks $\emptyset 1$ and $\emptyset 2$ are non-overlapping.

The preset data input IN0 is coupled through transistor 4 when the preset enable signal N13 is high. Data input IN0 must be stable when N13 is high and $\emptyset 2$ is high. The flip flop output N6 and inverted output N15 are latched on the falling edge 22 of $\emptyset 2$.

If we assume that IN0 represents a binary 1, then N6 is 1 and N15 is 0. Node BT1D falls to a 0 on the rising edge 21 of $\emptyset 1$. Since both BT1D and N13 are 0 at this time, the N16 output of NOR gate 15 goes high, turning DDM transistor 22 on hard, thereby generating a carry out signal C to the bit 1 stage over line 26.

When $\emptyset 2$ next rises as shown by reference numeral 23, BT1D is coupled through couplers 5 and 6 back to the input of inverter 7, so N15 rises and N6 falls. On the next rising edge of $\emptyset 1$, as shown by reference numeral 25, the low state of N6 is coupled through coupler 11 to inverter 12, and node BT1D rises, causing N16 and C to fall.

Figure 3:
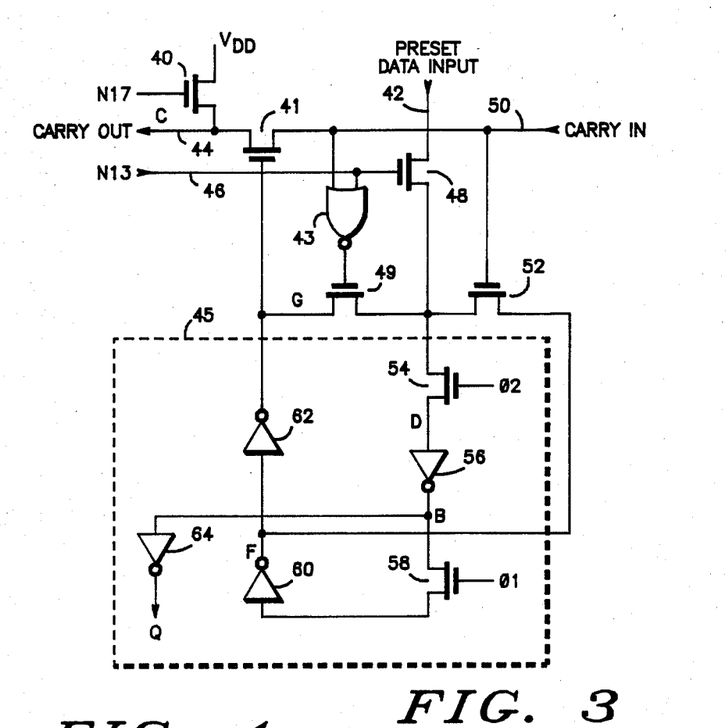
FIG. 3 shows a logic diagram illustrating one of the "bit 1 — N" stages of the high speed presettable counter of the present invention.

Referring now to FIG. 3, a logic diagram illustrating one of the "bit 1−N" stages of the high speed presettable counter of the present invention is shown. The bit 1−N stage comprises a storage element 45 comprising a two-phase clocked D-type flip flop in the form of inverters 56 and 64, whose input is received at preset data input 42, and which has an output Q and an inverted output B. The preset data input is coupled to the flip flop input through a coupling transistor 48 whose gate is controlled by a preset enable signal N13 on line 46.

The bit 1−N storage element also comprises an inverter 60 responsive to the flip flop output and generating an output signal to node F, and an inverter 62 whose input is coupled to node F and whose output is coupled to node G.

The preset data is coupled into the flip flop through a coupling transistor 54 which is gated by $\emptyset 2$ of the clock. The output of inverter 56 is coupled into inverter 60 through coupling transistor 58 which is gated by clock $\emptyset 1$.

Outside the dashed line portion 45 representing the storage element of the bit 1−N stage, the remainder of the circuit elements are employed primarily for the carry out operation to the next stage.

NOR gate 43 has a first input coupled to line 13 for receiving the preset enable signal N13 and a second input coupled to the carry in signal over line 50. A coupling transistor 49 is coupled between the drain of coupling transistor 54 and node G, and its gate is connected to the output of NOR gate 43. Another coupling transistor 52 is coupled between the drain of transistor 54 and node F, and its gate is gated by the carry in signal over line 50.

The carry in signal is also gated through coupling transistor 41 to the source of DDM transistor 40, whose drain is coupled to VDD and whose gate is controlled by a gate control signal N17. Coupling transistor 41 has its gate connected to node G. A carry out signal is generated over line 44, which is connected to the source of DDM transistor 40.

Figure 4:
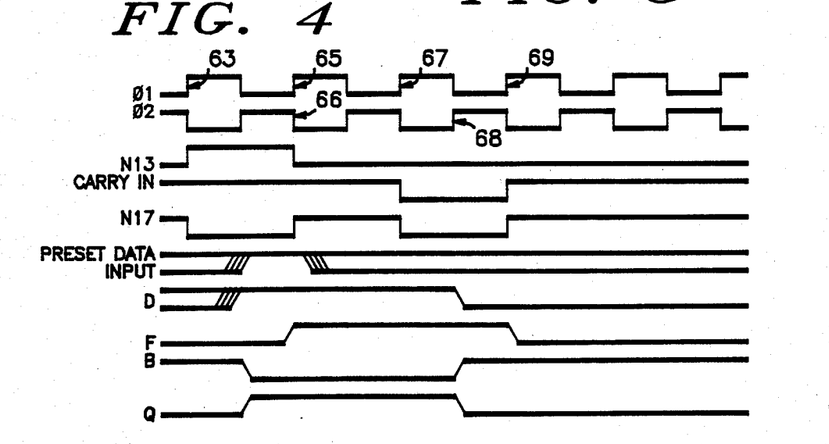
FIG. 4 shows a timing diagram illustrating the operation of the "bit 1 — N" stage shown in FIG. 3.

FIG. 4 shows a timing diagram illustrating the operation of the "bit 1−N" stage shown in FIG. 3. The preset data input is coupled through transistor 48 when the preset enable signal N13 is high. The data input must be stable when N13 is high and $\emptyset 2$ is high. The flip flop output Q and inverted output B are latched on the falling edge 66 of $\emptyset 2$.

Assuming that the preset data input represents a binary 1, then Q is 1 and B is 0. Node F rises to 1 on the rising edge 65 of $\emptyset 1$. Note that the DDM gate control signal N17 is held low during the preset operation and then goes high on the rising edge 65 of $\emptyset 1$.

The preset operation occurs from rising edge 63 of $\emptyset 1$ to rising edge 65 of $\emptyset 1$. Between rising edges 65 and 67 of $\emptyset 1$ is a data hold operation. Since node F is high at this time, node G is low, so coupling transistor 41 is not turned on. Thus no carry signal is transmitted between lines 44 and 50.

Between the rising edge 67 of ∅1 and the next rising edge 69 of ∅1 occurs a complementing operation, when the Q output changes to its complement. After the rising edge 67 of ∅1 the carry in signal input to NOR gate 43 is low, as is the preset enable signal N13 input to NOR gate 43. Thus coupling transistor 49 is enabled. At the rising edge 68 of ∅2 the low logic level output of inverter 62 is coupled into the input of inverter 56, causing B to rise and Q to fall.

From the rising edge 69 of ∅1 onward there is a hold operation, during which Q and B remain stationary. The conditions for maintaining the hold operation are that N13 is low and the carry in signal is high at the same time.

Figure 5:
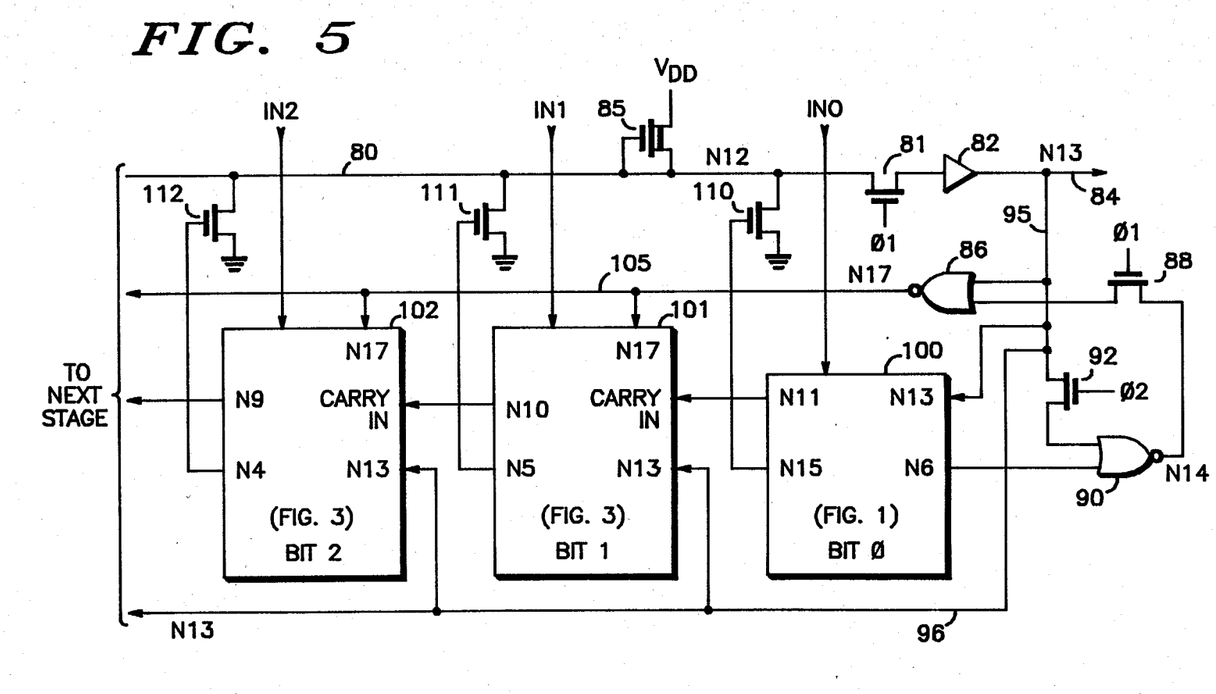
FIG. 5 shows a logic diagram illustrating the combination of FIGS. 1 and 3 to provide a 3-stage counter.

With reference to FIG. 5, a logic diagram illustrating the combination of FIGS. 1 and 3 to provide a 3-stage counter is shown.

The bit 0 counter stage is that shown in FIG. 1 and the bit 1 and bit 2 stages are that shown in FIG. 3. The various inputs and outputs to the counter stages are identified on the drawing.

The "all zero minus one" line 80 is coupled to VDD and to the drains of transistors 110-112, each of which have their sources connected to ground. Transistor 110 has its gate coupled to the complementary output N15 of the bit 0 stage. Transistor 111 has its gate connected to the output N5 of the bit 1 stage, and transistor 112 has its gate connected to the output N4 of the bit 2 stage. When N4, N5, and N15 are all low, N12 goes high, representing the "all zero minus one" condition—i.e., all stages are zero except for the bit 0 stage which still contains a 1.

Figure 6:
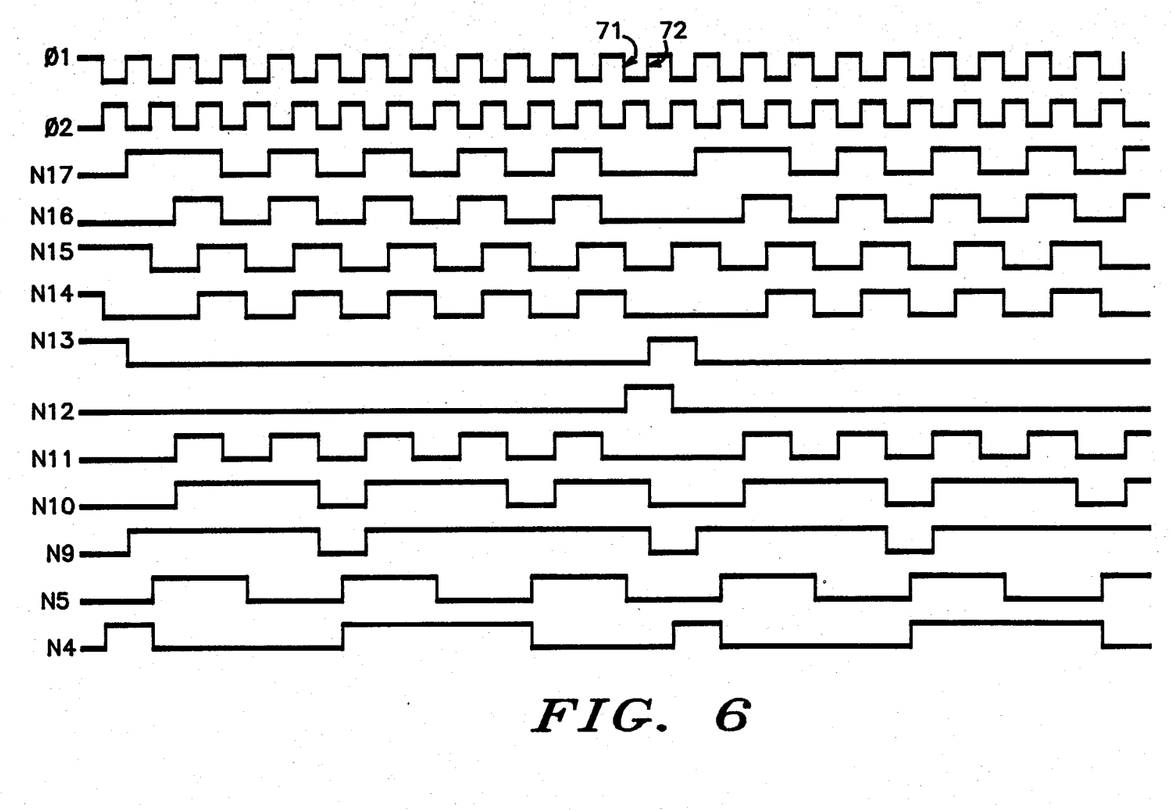
FIG. 6 shows a timing diagram illustrating the operation of the 3-stage circuit shown in FIG. 5.

FIG. 6 shows a timing diagram illustrating the operation of the 3-stage circuit shown in FIG. 5. The "all zero minus one" condition is illustrated at time 71, where N4, N5, and N15 are all low. On the next ∅1 clock, represented by reference numeral 72, coupler 81 couples the N12 signal through amp 82, and the preset enable signal N13 goes high.

Referring back to FIG. 5, the N13 signal represents one input into NOR gate 86, and via ∅2 coupler 92 into NOR gate 90. The N6 output of the bit 0 stage forms the other input into NOR gate 90, whose output represents a delayed "all zero minus one" signal N14. Signal 14 passes through ∅1 coupler 88 into the other input to NOR gate 86. The output of NOR gate 86 forms the DDM gate control signal N17 for the bit 1 and subsequent stages.

Figure 7:
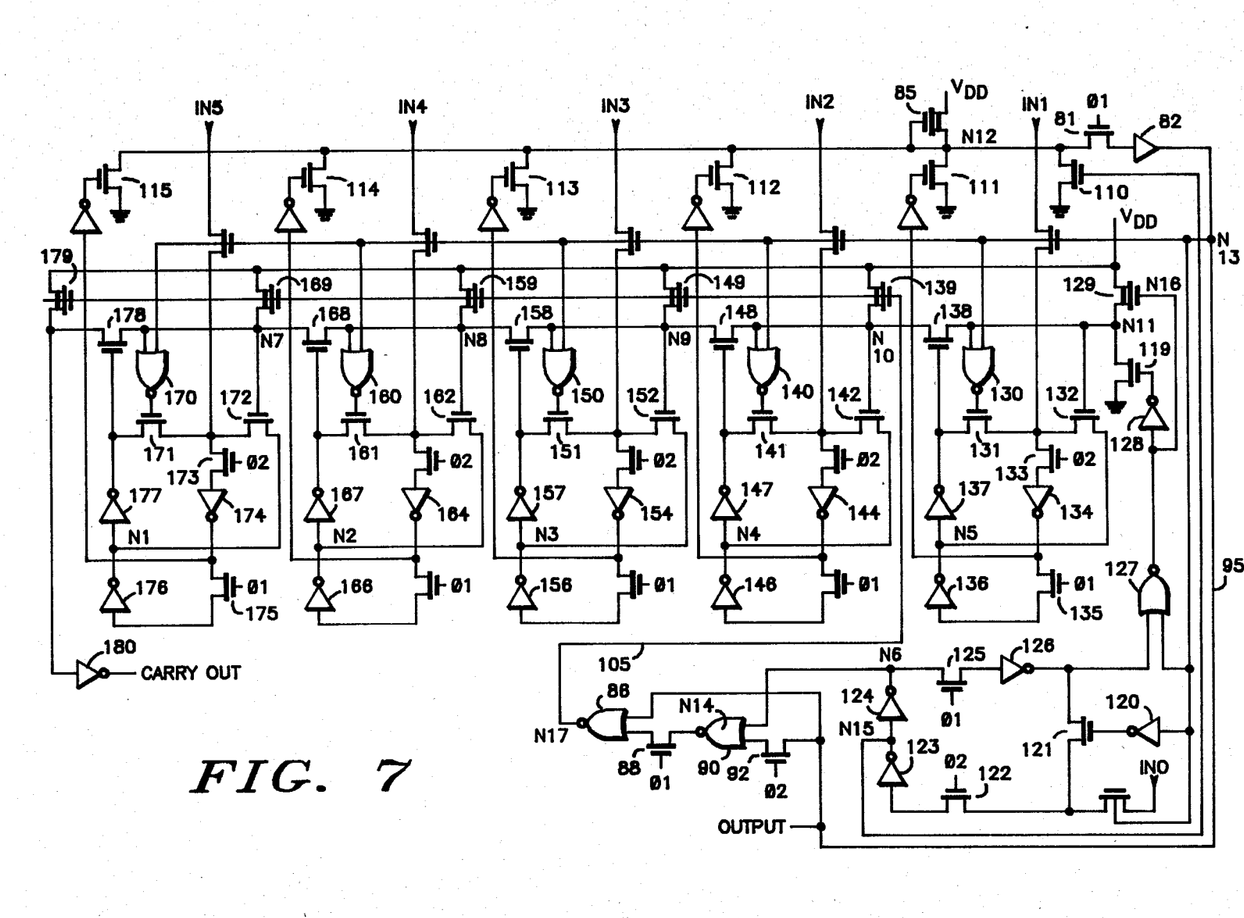
FIG. 7 shows a logic diagram illustrating a 6-stage counter, in accordance with a preferred embodiment of the invention.

With reference to FIG. 7, a logic diagram illustrating a 6-stage counter, in accordance with a preferred embodiment of the invention, is shown.

Each counter stage comprises circuit elements essentially identical to those previously discussed above regarding FIGS. 1, 3, and 5. IN0-IN5 represent the preset data inputs to counter stages 0-5, respectively. A carry out signal goes high when the input into inverter 180 goes low. This condition occurs when the inverter 180 input is coupled via enabled transistors 178, 168, 158, 148, 138, and 119 to ground.

When the counter shown in FIG. 7 is preset with a given binary number, it commences to count down until it reaches the "all zero minus one" condition, whereupon signal N12 goes high. At the next ∅1 clock, the preset enable signal signal is generated. Also at this time the carry out signal is generated, since NOR gate 127 is generating a low output, and the output of inverter 128 is high, connecting node N11 to ground. Since N1-N5 are all low, the respective transistors 178, 168, 158, 148, and 138 are all turned on, so that the input of inverter 180 is pulled to ground.

OPERATION OF PREFERRED EMBODIMENT

The operation of the preferred embodiment shown in FIG. 7 will be described with reference to APPENDIX B, which represents a reproduction of a computer-generated timing chart.

Along the left-hand side of APPENDIX B appear time numbers in increments of five. Along the top of APPENDIX B appear the clock phases ∅1 and ∅2 and signals N1-N17. Where a "1" appears at a given point in APPENDIX B, that indicates that the corresponding clock phase or signal level is high.

Ignoring time=0, which represents an initial condition, let us look at time=5. At time=5, N12 is high, and N13 has already gone high.

At time=10, the preset data inputs IN0-IN5 are coupled through the respective ∅2 input couplers, such as 122, 133, etc. into the respective inverters 123, 133, etc. For the example illustrated in APPENDIX B the preset data inputs IN0-IN5 are assumed to be 001100, representing a binary "12". That is, IN5=0, IN4=0, IN3=1, IN2=1, IN1=0, and IN0=0.

At time=15, nodes N1-N6 are 001100, indicating that the stored data reflects the preset data input. Signal N17, the DDM gate control signal for the bit 1-5 stages, is high. Signal N16, the DDM gate control signal for the bit 0 stage is low, so node N11 is pulled to ground. Since node N4 is high, transistor 148 is non-conductive. Transistor 158 is also non-conductive, since node N3 is high. Thus no conductive path is formed between inverter 180 and ground, so the carry out signal remains low.

The counter proceeds to count down through time=120, at which point the outputs of inverters 134, 144, 154, 164, and 174 are all high, and N15 is low. At this time, none of the transistors 110-115 are ON, so N12 goes high, representing the "all zero minus one" condition.

At time=125, ∅1 goes high, turning ON coupler 81, so that signal N13 goes high. Simultaneously, node N5 goes low, inverter 137 output goes high, and coupling transistor 138 is enabled. Since nodes N1-N4 are also low, their corresponding coupling transistors are also ON, so that the input to inverter 180 is coupled to ground. Inverter 180 thus generates a carry out signal, indicating that the counter has counted down to zero.

Time=130 repeats the identical circuit conditions as did time=10, assuming that the preset data inputs again are 001100, and the timing sequence begins anew.

To explain the operation in a different way, when the circuit is operating as a presettable down counter, the output logic state from the Q outputs is:

| | |
|---|---|
| 001100 | Assume this number was preset. |
| . | |
| . | |
| 000010 | The counter is counting down. |
| 000001 | This is the all-zero minus 1 count. Prepare "Preset". |
| 000101 | "Preset" new count in counter. Skip the all 0 cycle. |
| 000100 | Counter is counting down again. |
| 000011 | |
| 000010 | |
| 000001 | |
| 000111 | "Preset" new count again. |

In a conventional down counter, the procedure is to preset immediately when all 0's are detected from all the Q outputs. In such a case, the output of the "all 0" line is used in the same cycle without any delay. I.e., the output of the "all 0" line has to be very fast to perform the new preset. However, if a one cycle delay is employed in the circuit, then an "all zero minus one" cycle signal is required, and a delay of one cycle is necessary to synchronize the preset timing.

Turning our attention now to the operation of the DDM transistors, when N17 is low, the carry chain DDM transistors 139, 149, 159, 169, and 179 are soft ON to VDD. When N17 is high, the carry chain DDM transistors are hard ON. For example, at time=120 signals N17, N16, and N11 are low, and N10 is high. Node N10 is charged up at time=105 and at time=110, since N17 and N5 are both high. Subsequently this charged-up level is held by the soft ON DDM transistors connected to VDD.

It is one feature of the operation of the preferred embodiment that several of the internal control signals are delayed by appropriate amounts to allow for signal propagation time through related parts of the circuitry.

For example, the generation of signal N13 is delayed half a clock cycle after receipt of signal N12 in order to allow for signal propagation time through the preset data input circuitry. Thus the nodes along the N12 conductor need not have fast rise times.

The DDM gate control signal N17 is also delayed by half a clock cycle to allow for signal propagation delays through the related circuitry. The DDM control signal N17 is delayed by the N12/N13 coupler and the N14/N17 input coupler 81, which is gated by the ∅1 clock. Both N12 and N14 are changed at the rising edge of ∅2. I.e., a half cycle delay is used from the N13/N14 input, and another half cycle delay is used from the N14 output to the N17 input. These delay times are necessary to provide a stable down count at high frequency. The maximum propagation delay time applies for the signal path between the input coupler of one stage and the input coupler of the next stage. These propagation delays are designed so as not to exceed a half cycle in duration.

Also, signal N11, representing the carry out signal from the bit 0 stage, is delayed by one clock cycle to allow for signal propagation delay through its related circuitry.

By employing an overlapped or "pipelined" mode of operation, including the early generation of the "all zero minus one" signal, the overall operation of the counter is not degraded by these momentary "holds".

Looking further at the internal circuit hold operations, and with reference now again to FIG. 1, the logic level at the drain of transistor 6 is read when ∅2 is high, and and the logic level is transferred to the input of inverter 7. It's then inverted at node N15 and node N6. The output logic state at N6 is stopped before the reaching the drain of transistor 11. I.e., the input logic state should be transferred from IN0 or BT1D when the output of inverter 2 is at a high level and when ∅1 is held high. If the propagation delay from BT1D or IN0 to N6 is less than the duration of the ∅2 high level, the circuit will work properly.

In the other state, when ∅1 is held high and ∅2 is low, the logic level at node N6 is transferred to BT1D through inverter 12. The signal is stopped at the drain of transistor 6 or the carry out node C. The input from IN0 to the drain of transistor 6 is gated by the logic level at node N13, which is gated by the ∅1 clock generator output (see FIG. 5). I.e., the preset data input is given when ∅1 is high (N13 is high) and stopped at transistor 6 and waiting for the ∅2 high level. N12 (see FIG. 5) is changed when ∅2 rises to its high level and is waiting for its next state. I.e., the output of N12 is delayed half a cycle by the N12/N13 coupler 81, and N13 is delayed half a cycle by the coupler 6. A total of one cycle delay occurs between the time N12 changes once to the next time N12 changes.

It will be apparent to those skilled in the art that the disclosed High Speed Presettable Counter may be modified in numerous ways and may assume many embodiments other than the preferred form specifically set out and described above.

For example, it will be understood by one skilled in the art that while the counter of the present invention has been implemented as a countdown counter it could also have been implemented as a different type of counter such as a countup counter or an up/down counter.

Accordingly, it is intended by the appended claims to cover all modifications of the invention which fall within the true spirit and scope of the invention.

APPENDIX A

Signal Definitions

∅1 is non-overlapping clock
∅2 is non-overlapping clock complement of ∅1
IN0 is preset data input into bit 0 stage
IN1 is preset data input into bit 1 stage
IN2 is preset data input into bit 2 stage
IN3 is preset data input into bit 3 stage
IN4 is preset data input into bit 4 stage
IN5 is preset data input into bit 5 stage
N1 is Q-output of bit 5 stage flip-flop
N2 is Q-output of bit 4 stage flip-flop
N3 is Q-output of bit 3 stage flip-flop
N4 is Q-output of bit 2 stage flip-flop
N5 is Q-output of bit 1 stage flip-flop
N6 is Q-output of bit 0 stage flip-flop
N7 is carry out from bit 4 stage
N8 is carry out from bit 3 stage
N9 is carry out from bit 2 stage
N10 is carry out from bit 1 stage
N11 is carry out from bit 0 stage
N12 is early "all zero minus 1" condition detect
N13 is preset enable
N14 is delayed "all zero minus 1" signal
N15 is complement of N6
N16 is DDM gate control signal for bit 0 stage
N17 is DDM gate control signal for bit 1−N stages
B is complement of $Q_N$ output of bit N stage

APPENDIX B

| T | ∅1 | ∅2 | N1 | N2 | N3 | N4 | N5 | N6 | N7 | N8 | N9 | N10 | N11 | N12 | N13 | N14 | N15 | N16 | N17 |
|---|----|----|----|----|----|----|----|----|----|----|----|-----|-----|-----|-----|-----|-----|-----|-----|
| 0 | 1 |   |   |   |   |   |   |   |   |   |   |     |     | 1   | 1   |     |     |     |     |
| 5 | 1 |   |   |   |   |   |   |   |   |   |   |     |     | 1   | 1   | 1   | 1   |     |     |
| 10 |  | 1 |   |   |   |   |   |   |   |   |   |     |     | 1   |     |     | 1   |     |     |
| 15 | 1 |   |   |   | 1 | 1 |   |   | 1 | 1 | 1 |     |     |     |     |     | 1   |     | 1   |

APPENDIX B-continued

| T | Ø1 | Ø2 | N1 | N2 | N3 | N4 | N5 | N6 | N7 | N8 | N9 | N10 | N11 | N12 | N13 | N14 | N15 | N16 | N17 |
|---|----|----|----|----|----|----|----|----|----|----|----|-----|-----|-----|-----|-----|-----|-----|-----|
| 20 |  | 1 | 1 | 1 |  | 1 | 1 | 1 | 1 | 1 |  |  |  |  |  |  |  |  | 1 |
| 25 | 1 |  | 1 |  | 1 | 1 | 1 | 1 |  | 1 | 1 |  |  |  |  |  | 1 | 1 |  |
| 30 |  | 1 | 1 |  | 1 |  | 1 | 1 | 1 | 1 | 1 |  |  |  | 1 | 1 | 1 | 1 |  |
| 35 | 1 |  | 1 |  | 1 |  | 1 | 1 | 1 | 1 |  |  |  |  | 1 | 1 |  |  |  |
| 40 |  | 1 | 1 |  | 1 | 1 | 1 | 1 | 1 | 1 |  |  |  |  |  |  |  |  |  |
| 45 | 1 |  | 1 |  |  |  | 1 | 1 | 1 | 1 | 1 |  |  |  |  |  | 1 | 1 |  |
| 50 |  | 1 | 1 |  |  |  | 1 | 1 | 1 | 1 | 1 |  |  |  | 1 | 1 | 1 | 1 |  |
| 55 | 1 |  | 1 |  |  |  | 1 | 1 |  |  |  |  |  |  | 1 | 1 |  |  |  |
| 60 |  | 1 | 1 |  |  | 1 | 1 | 1 |  |  |  |  |  |  |  |  |  |  |  |
| 65 | 1 |  |  | 1 | 1 | 1 | 1 | 1 | 1 | 1 | 1 |  |  |  |  |  | 1 | 1 |  |
| 70 |  | 1 |  | 1 | 1 |  | 1 | 1 | 1 | 1 | 1 |  |  |  | 1 | 1 | 1 | 1 |  |
| 75 | 1 |  |  | 1 | 1 |  | 1 | 1 | 1 | 1 |  |  |  |  | 1 | 1 |  |  |  |
| 80 |  | 1 |  | 1 | 1 | 1 | 1 | 1 | 1 | 1 |  |  |  |  |  |  |  |  |  |
| 85 | 1 |  |  | 1 |  |  | 1 | 1 | 1 | 1 | 1 |  |  |  |  |  | 1 | 1 |  |
| 90 |  | 1 |  | 1 |  |  | 1 | 1 | 1 | 1 | 1 |  |  |  | 1 | 1 | 1 | 1 |  |
| 95 | 1 |  |  | 1 |  | 1 | 1 | 1 |  |  |  |  |  |  | 1 | 1 |  |  |  |
| 100 |  | 1 |  | 1 |  | 1 | 1 | 1 | 1 |  |  |  |  |  |  |  |  |  |  |
| 105 | 1 |  |  |  | 1 | 1 | 1 | 1 | 1 | 1 |  |  |  |  |  |  | 1 | 1 |  |
| 110 |  | 1 |  |  | 1 |  | 1 | 1 | 1 | 1 | 1 |  |  |  | 1 | 1 | 1 | 1 |  |
| 115 | 1 |  |  |  | 1 |  | 1 | 1 | 1 | 1 |  |  |  |  | 1 | 1 |  |  |  |
| 120 |  | 1 |  |  | 1 | 1 | 1 | 1 | 1 | 1 |  |  | 1 |  |  |  |  |  |  |
| 125 | 1 |  |  |  |  |  | 1 |  |  |  |  |  | 1 | 1 |  |  |  |  |  |
| 130 |  | 1 |  |  |  |  |  |  |  |  |  |  |  | 1 |  | 1 |  |  |  |

What is claimed is:

1. A high speed presettable counter, said counter being driven by a two-phase non-overlapping clock, said counter comprising:
   a voltage source;
   a plurality of counter stages, each stage comprising
      logic means for storing a binary number and generating an output corresponding to said stored binary number,
      a preset data input,
      a preset data enable input responsive to a preset data enable signal for loading into said logic means a binary number received over said preset data input,
      a carry input, and
      means responsive to said stored binary number and to said carry input for generating a carry output;
   a plurality of coupling transistors, each coupled between the carry output of a given counter stage and the carry input of the next higher counter stage, said coupling transistors being enabled in response to the output of said respective given counter stage;
   a plurality of dynamic depletion mode (DDM) gating transistors, each coupled between said voltage source and the carry output of a respective counter stage, said DDM gating transistors being enabled in response to a gate control signal;
   means responsive to all of said counter stage outputs for generating an "all zero minus one" signal when all but the lowest order counter stage output is a zero;
   means responsive to said preset data enable signal for generating said gate control signal, said means including a pair of first and second enhancement mode gating transistors each responsive, respectively, to a different phase of said clock;
   means responsive to said "all zero minus one" signal for generating said preset data enable signal, said means including a third enhancement mode gating transistor responsive to one phase of said clock;
   means, including a DDM transistor, in the lowest order counter stage and responsive to the binary number stored in said stage for generating said carry output from said stage, said means including a pair of fourth and fifth enhancement mode gating transistors each responsive, respectively, to a different phase of said clock,
   whereby the generation of said gate control signal, of said preset data enable signal, and of said carry output from said lowest order counter stage is each delayed to allow for signal propagation delays through said counter.

2. The high speed presettable counter recited in claim 1 wherein said logic means comprises a flip flop.

3. The high speed presettable counter recited in claim 1 wherein said logic means for all but said lowest order counter stage comprises
   a flip flop comprising
      a first inverter responsive to said preset data input,
      a second inverter responsive to the output of said first inverter and generating an output,
      a sixth enhancement mode gating transistor coupled between said preset data input and said first inverter, said sixth transistor being gated by a first phase of said clock, and
      a seventh enhancement mode gating transistor coupled between said first and second inverters said seventh transistor being gated by a second phase of said clock;
   a third inverter responsive to the output of said second inverter and generating an output to the coupling transistor associated with said logic means;
   a NOR gate having as inputs thereto said preset data enable signal and said carry input, said NOR gate generating an output;
   an eighth enhancement mode gating transistor coupled between the output of said second inverter and said preset data input, said eighth transistor being gated by said carry input; and
   a ninth enhancement mode gating transistor coupled between the output of said third inverter and said preset data input, said ninth transistor being gated by the output of said NOR gate.

4. The high speed presettable counter recited in claim 1 and further comprising
   an inverter coupled to the carry output of the highest order counter stage, said inverter generating a carry out signal when the carry output of each counter stage is zero.

5. The high speed presettable counter recited in claim 1 wherein said lowest order counter stage comprises
- a ground potential;
- a flip flop comprising
  - a first inverter responsive to said preset data input,
  - a second inverter responsive to the output of said first inverter and generating an output, and
  - a sixth enhancement mode gating transistor coupled between said preset data input and said first inverter, said sixth transistor being gated by a first phase of said clock;
- a third inverter responsive to the output of said second inverter and generating an output; a seventh enhancement mode gating transistor coupled between said second and third inverters, said seventh transistor being gated by a second phase of said clock;
- a first NOR gate having a first input coupled to said preset data enable signal and a second input coupled to the output of said third inverter, said first NOR gate generating an output representing said lowest order counter stage gate control signal;
- a fourth inverter responsive to said preset data enable signal and generating an output;
- an eighth enhancement mode gating transistor coupled between said preset data input and said second input to said first NOR gate, said eighth transistor being gated by the output of said fourth inverter;
- a fifth inverter responsive to the output of said first NOR gate and generating an output;
- a ninth enhancement mode gating transistor coupled to said ground potential and generating said lowest order counter stage carry out signal, said ninth transistor being gated by the output of said fifth inverter;
- a tenth enhancement mode gating transistor coupled to said preset data enable signal and having an output, said tenth transistor being gated by said first phase of said clock;
- a second NOR gate having a first input coupled to the output of said second inverter and having a second input coupled to the output of said tenth transistor;
- an eleventh enhancement mode gating transistor coupled to the output of said second NOR gate and having an output, said eleventh transistor being gated by said second phase of said clock;
- a third NOR gate having a first input coupled to said preset data enable signal and having a second input coupled to the output of said eleventh transistor, said third NOR gate generating said gate control signal.

* * * * *